(12) United States Patent
Crisp et al.

(10) Patent No.: US 8,994,170 B2
(45) Date of Patent: Mar. 31, 2015

(54) MICROELECTRONIC UNIT AND PACKAGE WITH POSITIONAL REVERSAL

(71) Applicant: Invensas Corporation, San Jose, CA (US)

(72) Inventors: Richard Dewitt Crisp, Hornitos, CA (US); Wael Zohni, San Jose, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/778,687

(22) Filed: Feb. 27, 2013

(65) Prior Publication Data

US 2014/0239491 A1    Aug. 28, 2014

(51) Int. Cl.
*H01L 23/00* (2006.01)
(52) U.S. Cl.
CPC ............... *H01L 24/06* (2013.01); *H01L 24/03* (2013.01); *H01L 24/83* (2013.01)
USPC .......................................... 257/724; 438/612
(58) Field of Classification Search
USPC ......... 257/735, 777, 686, 685, 723, 724, 728, 257/784, 786, 773, 774, 737, 738
See application file for complete search history.

(56) References Cited

U.S. PATENT DOCUMENTS

2003/0203537 A1   10/2003   Koopmans
2004/0159954 A1*   8/2004   Hetzel et al. ................. 257/777
2007/0063311 A1    3/2007   Ossimitz
2007/0296090 A1   12/2007   Hembree
2008/0203575 A1    8/2008   Thomas et al.

FOREIGN PATENT DOCUMENTS

KR    10-2010-0002873 A    1/2010

OTHER PUBLICATIONS

International Search Report and Written Opinion for Application No. PCT/US2014/018546 dated Jun. 23, 2014.

* cited by examiner

*Primary Examiner* — Whitney T Moore
(74) *Attorney, Agent, or Firm* — Lerner, David, Littenberg, Krumholz & Mentlik, LLP

(57) ABSTRACT

A semiconductor unit includes a chip having left and right columns of contacts at its front surface. Interconnect pads are provided overlying the front surface of the chip and connected to at least some of the contacts as, for example, by traces or by arrangements including wire bonds. The interconnect pads alone, or the interconnect pads and some of the contacts, provide an array of external connection elements. This array includes some reversal pairs of external connection elements in which the external connection element connected to or incorporating the right contact is disposed to the left of the external connection element incorporating or connected to the left contact. Such a unit may be used in a multi-chip package. The reversed connections simplify routing, particularly where corresponding contacts of two chips are to be connected to common terminals on the package substrate.

28 Claims, 4 Drawing Sheets

MICROELECTRONIC UNIT AND PACKAGE WITH POSITIONAL REVERSAL

BACKGROUND OF THE INVENTION

The present invention relates to microelectronic packaging.

A typical semiconductor chip is formed as a generally thin, rectangular solid having front and rear major surfaces and small edge surfaces extending between the front and rear surfaces. The thickness or distance between the front and rear surfaces of the chip typically is many times smaller than the length and width of the chip measured in the plane of the front surface or rear surface. The chip typically has contacts on its front surface and electronic circuitry within the chip connected to the contacts. In use, the contacts are electrically connected to a larger circuit. Ordinarily, chips are manufactured by treating a larger, flat wafer to form the electronic circuitry and contacts of numerous chips simultaneously, and then severing the wafer along lines referred to as "dicing lanes" which form the edges or boundaries of the individual chips.

Chips typically are mounted in structures referred to as packages. A package may include a package substrate such as a small circuit panel having terminals thereon. The chip is physically attached to the package substrate, and the contacts of the chip are electrically connected to the terminals of the package substrate. The package substrate, with or without other components, provides physical protection for the chip. Moreover, the terminals of the package substrate are arranged so that the package as a whole can be readily mounted to a circuit panel or other structure to provide the interconnection between the chip and the larger circuit. Many chip packages have terminals that may be larger than the contacts of the chip, spaced apart from one another at larger intervals than the contacts of the chip, or both, so that the terminals can be soldered readily to conductive structures on a larger circuit panel using standard bonding techniques such as surface mounting. For example, the terminals on a chip package may be arranged in a pattern corresponding to a formal or informal industry standard such as those published by the JEDEC Solid State Technology Association.

Certain semiconductor chips are provided with their contacts disposed in one or more columns extending in a column direction along the front face of the chip. Typically, the column direction is parallel to two edges of the chip. For example, the column or columns of contacts may be disposed midway between the left and right edges of the chip and may be parallel to the edges of the chip. Memory chips such as dynamic random access memory ("DRAM") chips commonly are provided in this configuration. Chips of this type commonly are packaged using a package substrate having upper and lower surfaces, terminals at the lower surface, and an aperture in the form of an elongated slot extending through the substrate from the upper surface to the lower surface. The substrate may have bond pads at the lower surface adjacent the slot, the bond pads being electrically connected to the terminals by traces on the package substrate. The chip is mounted to the upper surface of the package substrate with the front face of the chip facing downwardly toward the package substrate and with the column or columns of contacts on the chip aligned with the slot in the package substrate. The contacts of the chip are connected to the bond pads of the package substrate by wire bonds extending through the slot in the package substrate, so that the contacts of the chip are electrically connected to the terminals of the package substrate. The wire bonds typically are covered by an encapsulant, which fills the slot. The terminals at the lower surface of the package substrate can be bonded to contact pads on a circuit panel so that the chip is interconnected with a larger circuit incorporated in the circuit panel.

Some semiconductor packages contain multiple chips in a stacked configuration and may occupy an area on the circuit board that is the same as, or only slightly larger than, a package containing a single chip of the same type. This conserves space on the circuit board. Moreover, stacking plural chips in a package reduces the number of packages that must be mounted to the circuit board to form the completed circuit and, therefore, can reduce the cost of the final product. It is often possible to connect corresponding contacts of the plural chips in a stacked configuration to a common terminal on the package. For example, with almost all chips, the power and ground contacts of plural chips can be connected to common power and ground terminals on the package substrate. Memory chips such as DRAM chips typically have numerous contacts in addition to the power and ground contacts which can be connected in common. For example, typical DRAM chips utilize address and command contacts, which are arranged so that the corresponding address and command terminals of plural chips can be connected together to receive the same signals during operation. Each chip typically has some other contacts which must be connected to unique terminals on the package substrate which are not shared with contacts on other chips. For example, where a package contains memory chips, one or more contacts on each chip may be arranged to receive chip select signals designating a particular chip as the recipient of a read or write command.

Connecting corresponding contacts of plural chips in a package to common terminals on the package substrate reduces the total number of terminals required on the package substrate. If each chip in a stack has N contacts, the number of terminals on a package substrate carrying two chips in stacked configuration can be considerably less than 2N. This is advantageous, inasmuch as it saves space and simplifies the package substrate and the mating circuit board.

One type of stacked package incorporates a bottom chip having its front face facing downwardly toward the package substrate and its rear face facing upwardly, away from the package substrate. A top chip is disposed over the bottom chip. The rear face of the top chip faces downwardly, whereas the front face of the top chip faces upwardly, so that the top and bottom chips are arranged in rear face-to-rear face or "back-to-back" configuration. Where both chips in the stack have columns of contacts disposed adjacent the middle of their respective front surfaces, as in the DRAM chips discussed above, the bottom chip can be electrically connected to the terminals of the package substrate using wire bonds extending through an elongated slot in the package substrate to bond pads adjacent the slot in the same manner as discussed above. The upwardly facing contacts of the top chip can be connected to the package substrate by wire bonds, which extend from the contacts of the top chip, over the front face of the top chip and past the edges of the top chip, and extend downwardly adjacent the edges of the stacked chips. These wire bonds join additional bond pads on the package substrate disposed near the edges of the bottom chip. The additional bond pads are also connected to terminals on the package substrate by conductive traces on the substrate.

Where each chip has two or more columns of contacts, including a left column and a right column, a problem arises due to the opposite orientations of the two chips in the stack. The top chip, which is disposed in a front face up orientation, has the left column of contacts disposed to the left in the frame of reference of the package substrate and has the right column of contacts disposed to the right in the same frame of reference. Stated another way, the left column of contacts of the top chip lies closer to the left edge of the substrate, whereas the right column of contacts of the top chip lies closer to the right edge of the substrate. The bottom chip, however, is in an inverted, front face down orientation. Thus, the left column of contacts of the bottom chip lies closer to the right edge of the package substrate, whereas the right column of contacts lies closer to the left edge of the package substrate. The wire bonds from the contacts of the right column in the bottom chip will land at bond pads along the left edge of the slot. It is difficult to provide traces on the package substrate that cross the slot. Therefore the contacts of the right column of contacts on the bottom chip must be connected to terminals disposed between the slot and the left edge of the substrate. Conversely, the contacts of the bottom chip left column will be connected to terminals disposed between the right edge of the slot and the right edge of the substrate.

If corresponding contacts of the two chips are to be connected to common terminals on the package substrate, at least some of the wire bonds emanating from the left column of contacts on the top chip must pass to the right over the front face of the top chip and must cross the right edge of the top chip and connect to bond pads adjacent the right edge of the package substrate. Conversely, at least some wire bonds emanating from the contacts in the right column on the top chip must pass over the left edge of the top chip and join traces adjacent the left edge of the substrate. This implies that the wire bonds emanating from at least some of the contacts on the top chip will cross one another. Such an arrangement can introduce reliability problems, particularly where the wire bonds are closely spaced in the column direction. The wire bonds can be displaced in the column direction as, for example, by encapsulant applied to cover the wire bonds during manufacture. Such displacement can push one wire bond into contact with an adjacent, crossing wire bond. Such contact can lead to misrouted signals and render the packaged chips inoperative. Thus, further improvement would be desirable.

BRIEF SUMMARY OF THE INVENTION

One aspect of the present invention provides a semiconductor unit. A unit according to this aspect of the invention includes a first chip having oppositely directed front and rear surfaces and having left and right edges bounding the front and rear surfaces and spaced apart from one another in a lateral direction. The first chip also has left and right columns of contacts at the front surface. The columns of contacts extend in a column direction, transverse to the left-right direction. A unit according to this aspect of the invention also incorporates interconnect pads overlying the front surface of the chip. The interconnect pads are connected to at least some of the contacts. The interconnect pads together with the contacts, or the interconnect pads alone, form an array of external connection elements. The external connection elements are connected to the contacts of the chip, such that a first set of the external connection elements including at least some contacts of the right column or interconnect pads connected to contacts of the right column is disposed to the left of a second set of the external connection elements, which includes at least some contacts of the left column or interconnect pads connected to contacts of the left column. Stated another way, the array of external connection elements includes at least some external connection elements where the left and right column locations of the contacts are reversed.

Such a unit can be used, inter alia, in a stack package having back-to-back orientation as discussed above. Where one of the chips in the stack package is replaced by a unit as discussed above, the need for crossing wire bonds can be eliminated.

The contacts of the chip may be arranged in pairs, each including one contact of the left column and one contact of the right column, and the interconnect pads may also be arranged in pairs associated with at least some of the pairs of contacts. Each pair of interconnect pads may include a left interconnect pad connected to one contact of the associated pair of contacts and a right interconnect pad disposed to the right of the left interconnect pad connected to the other contact of the associated pair of contacts. The first set of external connection elements may include the left interconnect pads, whereas the second set of external connection elements may include the right interconnect pads. The pairs of contacts may include one or more reversal pairs. The left interconnect pad of each reversal pair is connected to the right contact of the associated pair of contacts, whereas the right interconnect pad of each reversal pair is electrically connected to the left contact of the associated pair of contacts. The pairs of contacts may also include one or more non-reversal pairs. In a non-reversal pair, the left interconnect pad is connected to the left contact of the associated pair of contacts, whereas the right interconnect pad is connected to the right contact of the associated pair of contacts.

The pairs of interconnect pads may be disposed so that the left interconnect pads of the various pairs form a left column of interconnect pads and the right interconnect pads of the various pairs form a right column of interconnect pads, the columns of interconnect pads extending in the column direction, parallel to the columns of contacts on the chip. The unit may include a redistribution layer overlying at least a portion of the front surface of the chip. The redistribution layer may include the interconnect pads, and may include redistribution conductors connecting the interconnect pads to at least some of the contacts on the chip.

Alternatively, the unit may include a redistribution interposer disposed on the front surface of the chip. The interconnect pads may be disposed on the redistribution interposer. The redistribution interposer also may have bond pads electrically connected to the interconnect pads, such as by traces on the redistribution interposer. The bond pads are connected by wire bonds to the contacts of the chip, so that the contacts of the chip are electrically connected to the interconnect pads. The contacts and interconnect pads may be provided as reversal or non-reversal pads, depending upon the arrangement of the redistribution traces on the redistribution interposer. The bond pads may be disposed in pairs, each pair of bond pads being associated with one pair of interconnect pads and with one pair of contacts. Each pair of bond pads desirably includes a left bond pad and a right bond pad. The left bond pad desirably is connected to the right contact of the associated pair of contacts by a first wire bond, whereas the right bond pad may be connected to the left contact of the associated pair of contacts by a second wire bond. The second wire bond may extend above the first wire bond, so that the first and second wire bonds do not cross one another.

In a further variant, some of the contacts of the chip may serve as external connection elements, whereas other contacts of the chip are electrically connected to interconnect pads which serve as external connection elements.

A further aspect of the present invention provides a semiconductor package. A package according to this aspect of the invention desirably includes a chip having oppositely directed front and rear surfaces, left and right edges spaced apart from one another in a left-right direction bounding the front and rear surfaces, and left and right columns of contacts at the front surface extending in a column direction transverse to the left-right direction. The semiconductor package according to this aspect of the present invention also includes interconnect pads overlying the front surface of the first chip. Here again, the interconnect pads are connected to at least some of the contacts. The interconnect pads and the contacts, or the interconnect pads alone, form an array of external connection elements, such that a first set of the external connection elements including at least some contacts of the right column or including interconnect pads connected to contacts of the right column is disposed to the left of a second set of the external connection elements, including at least some contacts of the left column or interconnect pads connected to contacts of the left column.

The package according to this aspect of the invention desirably includes a package substrate. The first chip desirably is disposed above the package substrate, with the front surface of the first semiconductor chip facing upwardly. The package desirably also includes left leads extending from the first set of external connection elements over the left edge of the first semiconductor chip to the package substrate and right leads extending from the second set of external connection elements over the right edge of the first semiconductor chip to the package substrate. The left and right leads may be wire bonds. The package may further include a second or bottom chip, which also has oppositely directed front and rear surfaces, left and right edges spaced apart from one another in a left-right direction of the chip, and bounding the front and rear surfaces. The first and second chips desirably are disposed in a stack with the rear surfaces of the chips facing one another and with the front surface of the second chip facing downwardly. Thus, the left edge of the first chip and the right edge of the second chip define a left side of the stack, whereas the right edge of the first chip and the left edge of the second chip define a right side of the stack. The package substrate desirably has a bottom surface and terminals at the bottom surface. At least some of the terminals desirably are electrically connected to at least some of the contacts on the first chip through the left and right leads, such that at least some of the electrical connections between terminals and contacts of the first chip include the interconnect pads. At least some of the terminals on the package substrate desirably are also electrically connected to contacts of the second chip. At least some of the terminals desirably are common terminal, with each common terminal being connected to a contact of the first chip and a contact of the second chip. Preferably, the contacts of the first and second chips are disposed in substantially identical arrangements on the front surfaces of the first and second chips, and the common terminals are connected to contacts at corresponding locations on the first and second chips. The package substrate may have a bond window, such as an elongated slot, aligned with the contacts of the second chip. Thus, the terminals may include left terminals offset from the bond window toward the left side of the stack and right terminals offset from the bond window toward the right side of the stack. At least some of the left terminals desirably are connected to contacts of the first chip through the left leads, whereas at least some of the right terminals desirably are connected to contacts of the first chip through the right leads. Here again, the package can be fabricated without the need for crossing wire bonds, and still may have contacts connected to common terminals.

Still other aspects of the invention include methods of making chip packages. A method according to this aspect of the invention desirably includes providing an assembly including a unit as discussed above and a package substrate, the unit being disposed above the package substrate, so that the front surface of the first semiconductor chip in the unit faces upwardly, away from the package substrate. The method according to this aspect of the present invention desirably includes connecting left leads so that the left leads extend from the first set of external connection elements over the left edge of the first chip to the package substrate and connecting right leads so that the right leads extend from the second set of external connection elements over the right edge of the first chip to the package substrate.

These and other objects, features, and advantages of the present invention will be more readily apparent from the detailed description of the preferred embodiments set forth below, taken in conjunction with the accompanying drawings.

DETAILED DESCRIPTION

Figure 1:
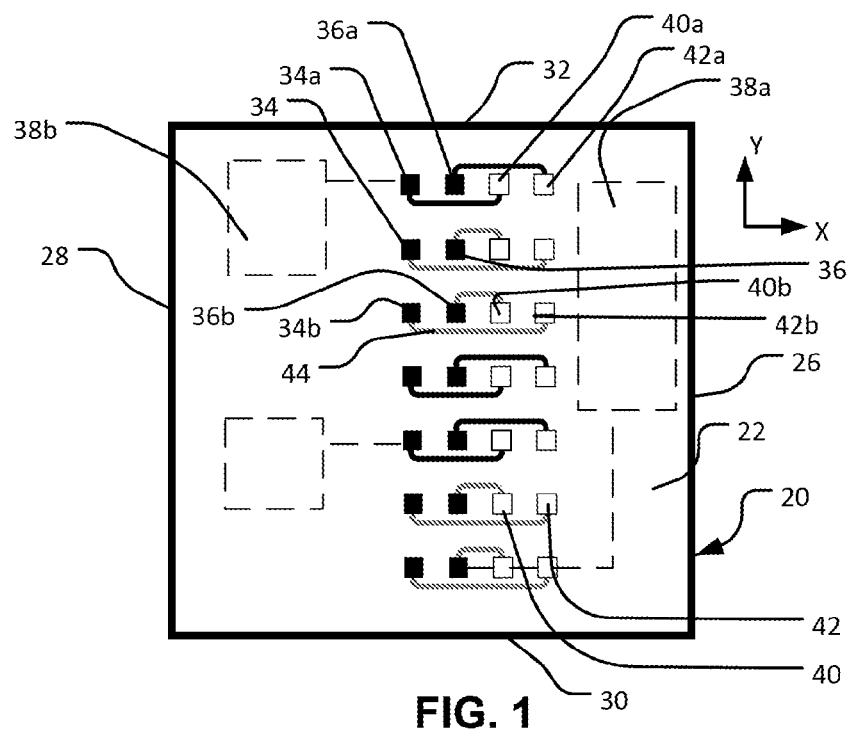
FIG. 1 is a diagrammatic top plan view of a unit according to one embodiment of the present invention.
Figure 2:
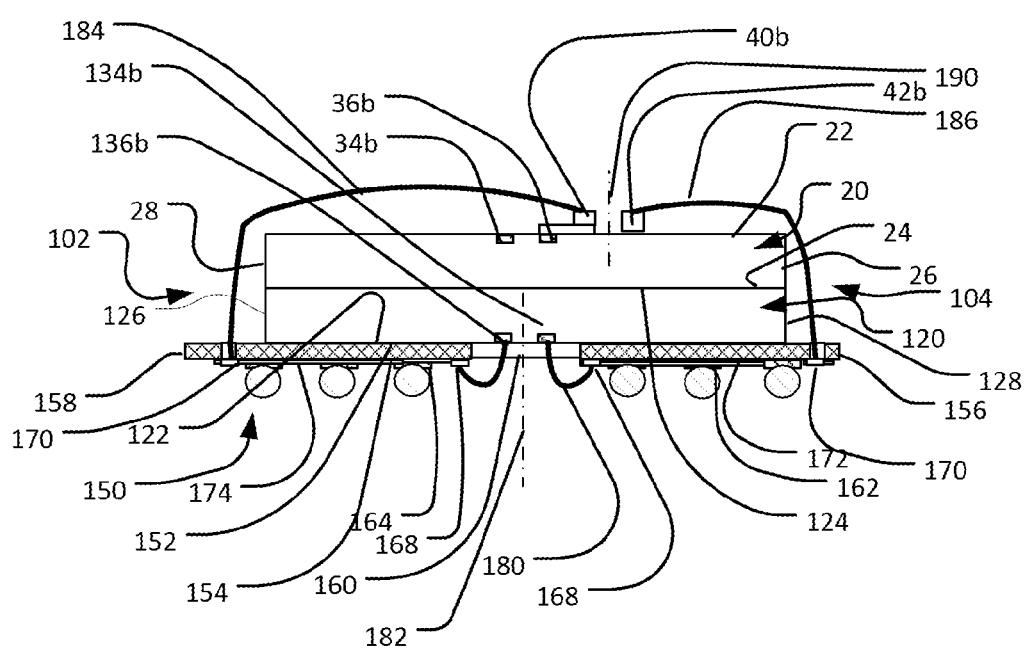
FIG. 2 is a diagrammatic sectional elevational view depicting a package incorporating the unit of FIG. 1 in conjunction with other elements.

A semiconductor unit in accordance with one embodiment of the invention includes a first chip 20 having a front surface 22 facing toward the viewer in FIG. 1 and a rear surface 24 seen in end view in FIG. 2. The chip also has a right edge 26 and a left edge 28 spaced apart from one another in a left-to-right or lateral direction, indicated by the arrow "X" in FIG. 1. Moreover, the chip has a first end 30 and a second end 32 spaced apart from one another in a column direction, transverse to the left-to-right or lateral direction, the column direction being indicated by the arrow "Y" in FIG. 1. The chip also has a left column of contacts 34 and a right column of contacts 36 at the front surface. As used in this disclosure with reference to a structure such as a chip or substrate, a statement that an electrically conductive element is "at" a surface of a structure indicates that, when the structure is not assembled with any other element, the electrically conductive element is available for contact with a theoretical point moving in a direction perpendicular to the surface of the structure toward the surface of the structure from outside the structure. Thus, a terminal, contact or other conductive element which is at a surface of a structure may project from such surface; may be flush with such surface; or may be recessed relative to such surface in a hole or depression in the structure. Further, the chip has internal electronic circuits 38, depicted in broken lines in FIG. 1.

The columns of contacts 34 and 36 extend in the column direction, parallel to edges 26 and 28. The left and right columns of contacts are disposed in a relatively narrow elongated contact zone. For example, the contact zone may have a width in the lateral direction substantially less than the width of the chip as, for example, less than a few mm wide and typically less than 1 mm wide. The contact zone may be disposed adjacent the mid-plane of the chip, equidistant from the right edge 26 and left edge 28. In the particular embodiment shown, all of the contacts are disposed in pairs of contacts, each such pair including one left contact 38 and one right contact 36. For clarity of illustration, only a few contacts and a few internal circuits are depicted. In actual practice, a chip may have hundreds of contacts and may have millions or billions of internal electronic circuits. Also, the thickness of the chip or distance between the front surface 22 and rear surface 24 is greatly exaggerated relative to the other dimensions of the chip in FIG. 2.

Unit 20 further includes left interconnect pads 40 and right interconnect pads 42 overlying the front surface of the chip and, thus, also disposed at the front surface. The interconnect pads are also disposed in columns extending in the column or Y-direction. Interconnect pads 40 and 42 are also arranged in pairs, each pair including one left interconnect pad 40 and one right interconnect pad 40. The interconnect pads are connected to the contacts by redistribution conductors in the form of traces 44 connecting each interconnect pad 40 and 42 with a contact 34 or 36. Thus, so that each pair of interconnect pads is electrically connected to a pair of contacts, and associated with the pair of contacts. The interconnect pads and traces may be fabricated by conventional methods using processes such as deposition and etching of conductive materials as, for example, copper and gold. The interconnect pads and traces may be formed directly on the front surface 22 of the chip as, for example, on a passivation layer such as an oxide or nitride layer, formed during manufacture of the chip, or may be deposited over a dielectric coating such as, for example, a spun-on dielectric layer adhering to the front face of the chip. The redistribution conductors or traces and the interconnect pads may be formed while the chips are in a wafer incorporating numerous chips, prior to severance of the chips from the wafer. The traces may be optionally covered by a further dielectric layer (not shown), but such further layer should have openings at the interconnect pads 40 and 42.

The associated pairs of contacts and interconnect pads include reversal pairs and non-reversal pairs. In each non-reversal pair, the left interconnect pad 40 is connected to the left contact 34 of the associated pair of contacts, whereas the right interconnect pad 42 is connected to the right contact 36 of the associated pair. For example, interconnect pads 40*a* and 42*a* are a non-reversal pair. The left interconnect pad 40*a* is connected to the left contact 34*a*, whereas the right interconnect pad 42*a* is connected to the right contact 36*a* of the associated pair of contacts. In each reversal pair, the left interconnect pad is connected to the right contact of the associated pair of contacts, whereas the right interconnect pad is connected to the left contact in the associated pair. For example, interconnect pads 40*b* and 42*b* are a reversal pair. Left interconnect pad 40*b* is connected to the right contact 36*b*, whereas right interconnect pad 42*b* is connected to the left contact 34*b*.

The left-column interconnect pads 40 constitute a first set of external connection elements. This set includes at least some external connection elements (the interconnect pads of the reversal set, such as pad 40*b*), which are connected to contacts 36 of the right column of contacts. The first set of external connection elements 40 lies to the left of a second set of external connection elements; namely, the right-column interconnect pads 42. The second set of external connection elements 42 includes at least some interconnect pads, which are connected to contacts 34 of the left column; namely, the right-column interconnect pads 42 of the reversal sets, such as interconnect pad 42*b*. However, the first set of external connection elements (pads 40) is disposed to the left of the second set.

A package according to one embodiment of the invention incorporates the unit of FIG. 1, together with a second semiconductor chip 120 (FIG. 2). Chip 120 is identical to the first chip 20. Thus, the chip has a front surface 122 and a rear surface 124, as well as contacts at the front surface arranged in columns and pairs as discussed above. Only two of these contacts 134*b* and 136*b* are visible in FIG. 2. Chip 120 also has a right edge 126 and a left edge 128. However, chip 120 is disposed with the front surface 122 facing downwardly and the rear surface 124 facing upwardly. Therefore, the positions of the left and right edges are reversed relative to those of the first chip 20. Stated another way, second chip 120 is the same as first chip 20, except that the second chip has been rotated 180° from the position of the first chip shown in FIG. 1 around an axis extending in the column direction. Thus, the right edge 126 of the second chip is disposed towards the left side of the drawing as seen in FIG. 2 and thus is aligned with the left edge 28 of first chip 20. Also, the left edge 128 of the second chip is disposed towards the right in the drawing and is aligned with the right edge 126 of the first chip.

The two chips are mounted back-to-back, with the rear surface 124 of the second or bottom chip facing upwardly, and with the first or top chip 20 disposed above the second chip. The first or top chip 20 is disposed in a face-up orientation, with the front surface facing 22 facing upwardly and the rear surface 24 facing downwardly towards the rear surface 124 of the second chip. For convenience, the side 104 of the chip stack defined by the right edge 26 of the first chip and the left edge 128 of the second chip is referred to as the right side of the stack, whereas the opposite side 102 of the stack, defined by the left edge 28 of the first chip and the right edge 126 of the second chip, is referred to as the left edge of the stack.

Because second or bottom chip 120 is inverted, the positions of the contact columns are also inverted from those of the first chip. Thus, contacts of the right column, such as contact 136*b* shown in FIG. 2, lie closer to the right edge 126 of the second chip and thus lie closer to the left side 102 of the stack than contacts of the left column, such as contact 134*b*.

The package further includes a package substrate 150. Package substrate 150 has an upper face 152 and a lower face 154. The package substrate has a right edge 156 and a left edge 158, as well as an aperture 160 in the form of an elongated slot extending parallel to the left and right edges of the substrate, i.e., into and out of the plane of the drawing as seen in FIG. 2. The package substrate includes electrically conductive features such as terminals. The terminals include right terminals 162, disposed between aperture 160 and right edge 156, and left terminals 164, disposed between the slot or aperture 160 and the left edge 158 of the package substrate. The electrically conductive features further include columns of central substrate bond pads 168 at the lower surface 154 of the substrate extending along aperture 160 on opposite sides thereof and peripheral substrate bond pads 170, disposed adjacent the right and left edges of the substrate. The peripheral substrate bonds pads are arranged for contact with wire bonds descending downwardly toward the substrate from above the upper surface 152. Stated another way, the peripheral substrate bond pads are at upper surface 152.

The package substrate further includes right traces 172, which are elongated electrical conductors connecting various ones of the right terminals 162 with central substrate bond pads 168, lying to the right of aperture 160, and with peripheral substrate bond pads 170 adjacent the right edge 156 of the substrate. Moreover, the substrate includes left traces 174 connecting the left terminals 164 to central substrate bond pads 168 lying to the left of aperture 160 and with peripheral substrate bond pads 170, disposed adjacent left edge 158.

The package substrate 150 is disposed below the second or lower chip 120, so that the edges 156 and 158 of the substrate extend parallel to the edges of the chips. Stated another way, the edges 156, 158 extend in the column directions of the chips and the elongated slot or aperture 160 also extends in the column direction, into and out of the plane of the drawing as seen in FIG. 2. The downwardly facing front surface 122 of second chip 120 thus confronts the upper surface 152 of the package substrate. An adhesive (not shown) or other bonding agent may be provided between these surfaces to secure the stacked chips to the package substrate. The columns of contacts 134 and 136 of the second chip are aligned with the slot or aperture 160 in the package substrate.

The contacts of the second chip are connected to the substrate central bond pads 168 by wire bonds 180. Wire bonds 180 are arranged so that the wire bonds from left column contacts of the second chip (such as contact 134*b*), which lie closer to the right edge of the stack and right edge of the substrate, extend to the right and extend to substrate central bond pads 168, lying along the right edge of aperture 160. Conversely, the right column of contacts, such as contact 136*b* seen in FIG. 2, lie closer to the left edge 102 of the stack and the left edge 158 of the package substrate. The wire bonds extending from the right row of contacts of the second chip, such as contact 136*b*, extend to the left in the frame of reference of the stack and substrate and thus extend to central substrate bond pads lying to the left of the aperture or slot 160. Thus, these wire bonds do not cross an imaginary medial plane 182 of slot 160, extending in the column direction, and do not cross one another.

Left leads in the form of left wire bonds 184 extend from the external connection elements of the first set, i.e., the left column of interconnect pads 40. These left leads or wire bonds 184 extend to the left from the first set of external connection elements or interconnect pads 40 in the frame of reference of the first chip and in the frame of reference of the stack and package substrate. These left leads or wire bonds 184 extend over the left edge 28 of the first chip and extend downwardly to the package substrate, where they join substrate peripheral bond pads 170, disposed adjacent the left edge 158 of the substrate. Thus, the left leads 184 are electrically connected to the left traces 174 and to left terminals 164.

Right leads in the form of wire bonds 186 extend to the right (in the frame of reference of the first chip, stack, and package substrate) from the second set of external connection elements or interconnection pads 42 of the first chip. The right leads or wire bonds 186 extend over the right edge 26 of the first chip and downward to the package substrate, where they join substrate peripheral bond pads 170, adjacent the right edge 156 of the package substrate. Thus, the right leads are electrically connected to the right traces 172 and thus to right terminals 162.

The left leads 184 and right leads 186 do not cross one another. The left leads are disposed entirely to the left of a theoretical medial surface 190, disposed between the first set of external connection elements or left interconnect pads 40 and the second set of external connection elements or contact pads 42.

The arrangement discussed above facilitates connection of corresponding contacts on the two chips to a common terminal. For example, right column contact 36*b* of first chip 20 corresponds to right column contact 136*b* of second chip 120. Each of these contacts is located in exactly the same location on the individual chip. Because right contact 36*b* of the first chip is associated with a reversal pair of interconnect pads, the right contact 36*b* is connected to the left interconnect pad 40*b* and thus connected by a left lead or wire bond 184 to the bond pads 170 at the left edge of the package substrate. Therefore, the right contact 36*b* is electrically connected to a left trace on the package substrate. Similarly, the right contact 136*b* is connected by a wire bond to a substrate central bond pad 168 lying to the left of aperture 160 and thus also connected to a left trace 174. Each of these left traces can reach any of the left terminals 164 without crossing the aperture or slot 160. If both of these left traces are connected to one left terminal 164, this provides common routing of both of contacts 36*b* and 136*b* to such terminal.

For the same reason, the left contact 34*b* of the first chip is connected through external connection element or interconnect pad 42*b* to a right trace 172, whereas the left contact 134*b* of the second chip is also connected by a wire bond 180 to a left trace 172. Therefore, both of these contacts can be routed, if desired, to a common one of the right terminals 162, again without any need for a trace to extend across the aperture or slot 160. This routing is also accomplished without crossing wire bonds. Moreover, there is no need to manufacture the chips in opposite or mirror image layouts; both chips 20 and 120 have the identical structure. Therefore, commonly manufactured chips available in quantities at low cost can be utilized in the package.

A unit according to a further embodiment of the invention (FIG. 3) incorporates a chip 220 similar or identical to the chip 20 discussed above with reference to FIGS. 1 and 2. Thus, chip 220 includes a right edge 226 and left edge 228, bounding the front surface 222 of the chip. Here again, the left and right edges are offset from one another in a lateral or left-to-right direction. The chip includes a left column of contacts 234 and a right column of contacts 236, the columns extending in a column direction, transverse to the lateral direction. Here again, the lateral direction is indicated by the arrow "X" in FIG. 3 and the column direction is indicated by the arrow "Y" in FIG. 3.

The unit includes a left column of interconnect pads 240 and a right column of interconnect pads 242 overlying the front surface 222 of the chip. In this embodiment, interconnect pads 240 and 242 are carried on a redistribution interposer 201, which may be in the form of a small piece of dielectric material. The redistribution interposer is secured to the front face 222 of the chip as, for example, by an adhesive (not shown). Redistribution interposer 201 also bears a first or right-hand column of bond pads 203 and a second or left-hand column of bond pads 205. The bond pads are connected to the interconnect pads 240 and 242 by traces or conductors 207 carried by the redistribution interposer 201. Here again, the contacts 234 and 236 are arranged in pairs, so that each such pair includes one contact 234 of the left column and one contact 236 of the right column. Likewise, the interconnect pads 240, 242 are also arranged in pairs, each including one left interconnect pad 240 and one right interconnect pad 242. The bond pads 203 and 205 likewise are arranged in pairs, each such pair of bond pads including one right or first bond pad 203 and one second or left bond pad 205. Each pair of interconnect pads 240, 242 is associated with one pair of bond pads 203, 205 and one pair of contacts 234, 236. The contacts and bond pads are arranged so that for each pair of bond pads 203, 205 and the associated pair of contacts 234, 236, there is a first or right bond pad 203 and a first or left contact 234 disposed at widely spaced lateral locations. Also, a second bond pad of the pair (the left bond pad 205) and a second contact of the associated pair of contacts (the right contact 236) are disposed at lateral locations between the lateral locations of the first bond pad and first contact. Stated another way, the second bond pads 205 and contacts 236 are disposed between the first bond pads 203 and the first contacts 234.

Figure 4:
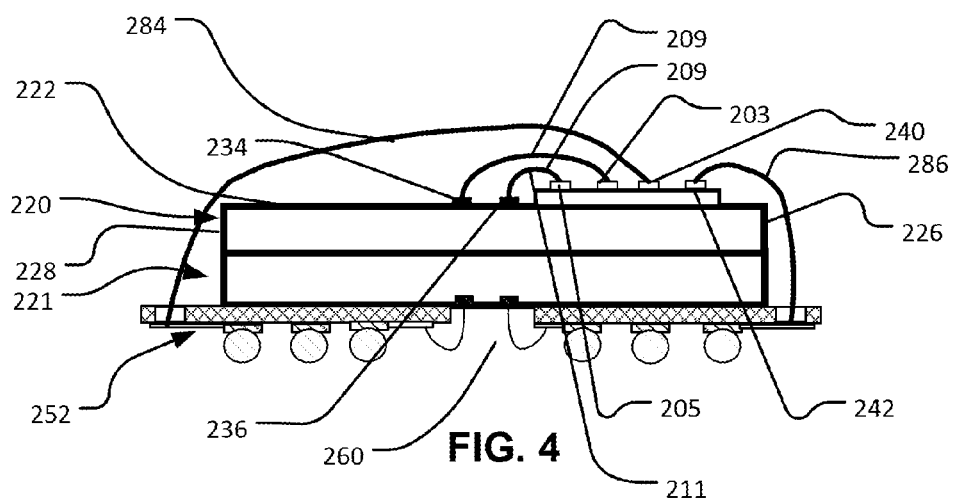
FIG. 4 is a diagrammatic sectional elevational view depicting a chip package incorporating the unit of FIG. 3 in conjunction with other elements.

The first or right-hand bond pad 203 of each pair is connected to the first or left-hand contact 234 of the associated pair of contacts on the chip by a first wire bond 209, best seen in elevational view in FIG. 4. The second or left-hand bond pad 205 of each pair is connected to the second or right-hand contact 234 of the associated pair of contacts on the chip by a second wire bond 211. The first wire bond 209 associated with each pair of bond pads extends above the second wire bond 211 associated with the same pair of bond pads. That is, the first wire bond 209 extends at a greater distance from the chip front surface 222 than the first wire bond 211. Thus, the second wire bond associated with each pair is nested within the first wire bond 209 associated with the same pair of bond pads. The wire bonds 211 and 209 do not cross one another.

In this embodiment as well, the pairs of contacts 234 and 236 and interconnect pads 240 and 242 include reversal pairs and non-reversal pairs. In a reversal pair, the left interconnect pad 240 is connected to the right contact 236, whereas the right interconnect pad 242 is connected to the left contact 234 of the associated pair of contacts. For example, interconnect pads 240 and 240a form a reversal pair. The left interconnect pad 240a is connected to the second or left bond pad 205a of the associated pair of bond pads. Bond pad 205a, in turn, is connected to the second or right contact 236a of the associated pair of contacts. Conversely, the right interconnect pad 242a is connected to the first or right bond pad 203a, which, in turn, is connected to the first or left contact 234a. In a non-reversal pair, such as contact pads 240b and 242b, the arrangement of traces on the redistribution interposer 201 is reversed, so that the left interconnect pad 240b is connected to the right or first bond pad of the associated pair, which, in turn, is connected to the left or first contact 234b of the associated pair, leaving the left interconnect pad 240b connected to the left contact 234b of the associated pair of contacts. Conversely, the right interconnect pad 242b is connected to the second or left-hand interconnect pad 205b and thus electrically connected to the second or right contact 236b of the associated pair of contacts.

A unit of this type can be used in conjunction with a second semiconductor chip 221 (FIG. 4) and substrate 252 substantially identical to those discussed above in connection with FIG. 1 to form a package. Here again, the first set or left column of interconnect pads 240 is connected by left leads or wire bonds 284, which extend to the left from the first set of interconnect elements or pads 240, over the left ledge 228 of chip 220 and downwardly toward the package substrate 252. The second set of interconnect elements 242 is connected by right leads or wire bonds 286, which extend to the right from the interconnect pads 242 and over the right edge 226 of chip 220 to substrate 252.

In this embodiment as well, the left column of interconnect pads 240 forms a first set of external connection elements. The first set of external connection elements includes at least some interconnect pads or connection elements that are connected to contacts 236 of the right column of contacts. Here again, the right interconnect pads 242 form a second set of external connection elements. These elements include at least some external connection elements or contact pads 242, which are connected to at least some contacts 234 of the left column. Nonetheless, the first set of external connection elements or interconnect pads 240 lies to the left of the second set of external connection elements or interconnect pads 242.

Figure 3:
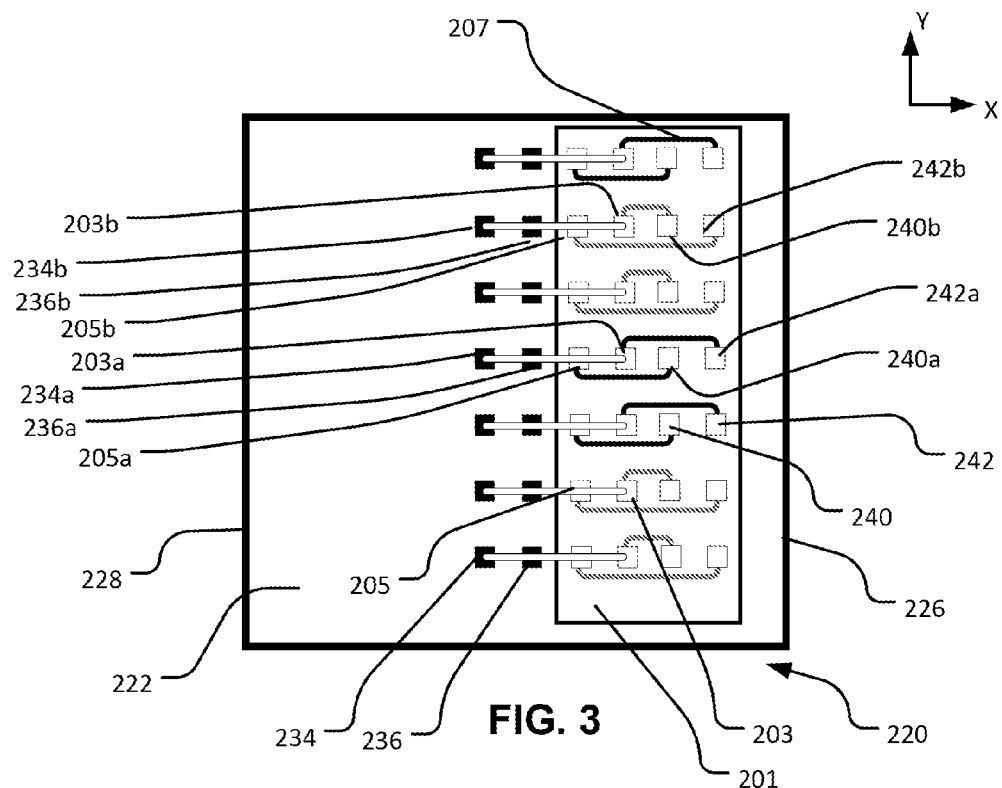
FIG. 3 is a diagrammatic top plan view of a unit according to a further embodiment of the invention.

Units and packages according to the embodiment of FIGS. 3 and 4 can provide the same functionality as the units and packages discussed above with reference to FIG. 1. Here again, there is no requirement for any crossing wire bonds, or for any traces crossing the slot 260 in package substrate 252. The nested wire bonds 209 and 211 that connect the contacts to the bond pads 203 and 205 do not cross one another, and, likewise, the left wire bonds 284 and right wire bonds 286 do not cross one another. The left leads 284 extend above the wire bonds 209 and 211, and do not cross these wire bonds.

A unit according to a further embodiment (FIG. 5) incorporates a first semiconductor chip 320, which, once again, has a right edge 326 and a left edge 328 offset from one another in a left-to-right or lateral direction and, once again, has a left column of contacts 334 and a right column of contacts 336 extending in a column direction, transverse to the lateral direction. Here again, the contacts 334 and 336 are provided at the front surface 322 of the chip. The unit according to FIG. 5 further includes interconnect pads 342 extending in a column of interconnect pads, parallel to the columns of contacts 334 and 336. The column of interconnect pads 342 is disposed to the right of the right column 336 of contacts. The interconnect pads 342 are connected to contacts 334 of the left column by traces 344, which may be similar to the traces 44 discussed above with reference to FIG. 1. In this embodiment, certain contacts of the chip, along with the interconnect pads, serve as external connection elements for the unit. A reversal pair of external connection elements includes a right contact, such as contact 336a, and an interconnect pad 342a, which is electrically connected to a left contact 334a. The left contact 334a is not used as an external connection element and may be covered as, for example, by a trace connected thereto or by a dielectric material. A non-reversal pair of external connection elements is provided by a pair of contacts, such as contacts 334b and 336b, without any interconnect pads. In this embodiment, the interconnect pads and some of the contacts cooperatively form the array of external connection elements. The array includes a first set of external connection elements consisting of the left contacts 334 of the non-reversal pairs and the right contacts 336 of the reversal pairs. The external connection elements of the first set are shown encircled by solid-line circles in FIGS. 5 and 6. The array of external connection elements also includes a second set of external connection elements consisting of the right contacts 336 of the non-reversal pairs and the contact pads 342. The external connection elements of the second set are shown encircled by broken-line circles in FIGS. 5 and 6. The first set of external connection elements includes at least some contacts of the right column, but is disposed entirely to the left of the second set of external connection elements. In this embodiment, as in the embodiments discussed above, the number of reversal pairs is entirely optional. The unit can be made with all pairs of external connection elements provided as reversal pairs or with only one or a few reversal pairs.

Figure 5:
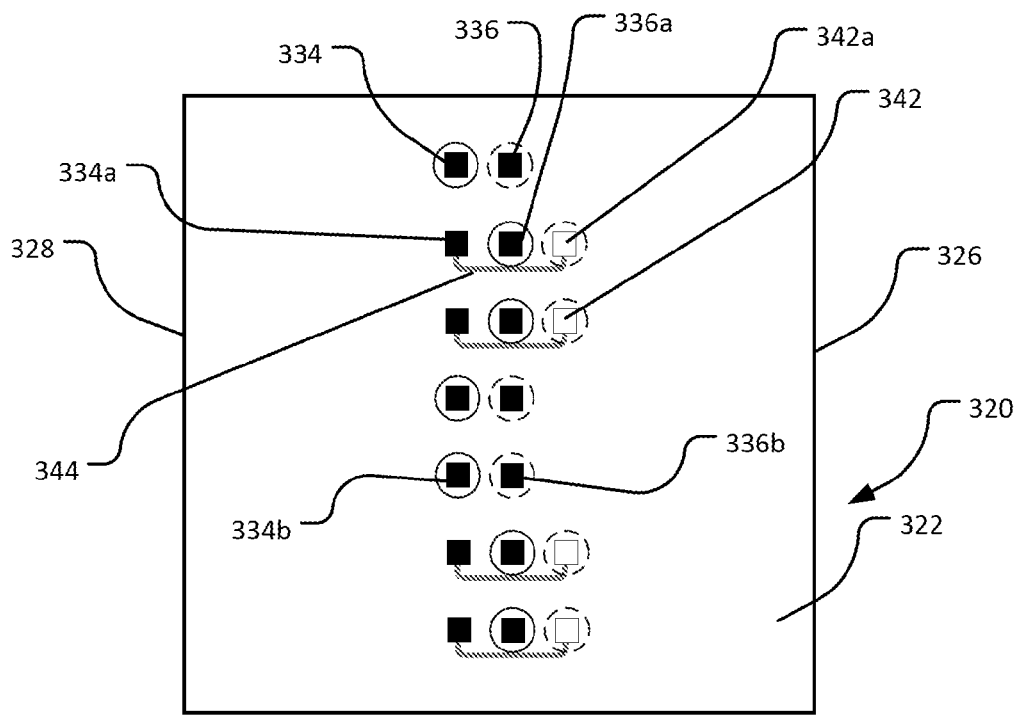
FIG. 5 is a diagrammatic top plan view of a unit in accordance with yet another embodiment of the present invention.
Figure 6:
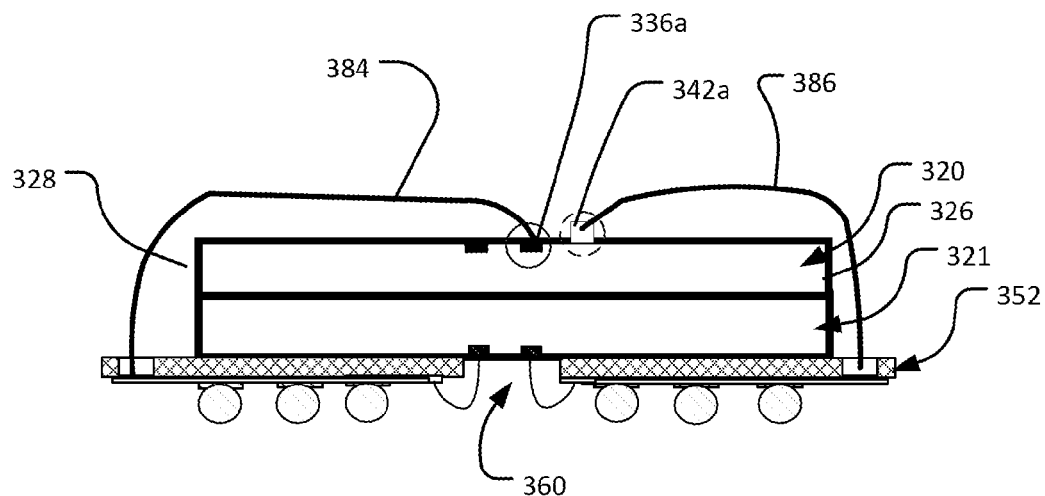
FIG. 6 is a diagrammatic sectional elevational view depicting a chip package incorporating the unit of FIG. 3 in conjunction with other elements.

As depicted in FIG. 6, the unit of FIG. 5 can be used in a semiconductor package similar to the packages discussed above. Here again, the unit is used in conjunction with a second semiconductor chip 321 and a package substrate 352, similar to the corresponding elements discussed above. Here again, left leads or wire bonds extend from the external connection elements of the first set, such as from contact 336a, over the left edge 328 of first chip 320 to the package substrate. Right leads or wire bonds 386 extend from the external connection elements of the second set, such as from interconnect pad 342 over the right edge 326 of the first chip, and extend downwardly to the package substrate 352. This embodiment can provide routing advantages similar to those discussed above. Here again, the connections to terminals on the package substrate, including connection of corresponding contacts of the chip to common terminals on the substrate, can be made without the need for crossing wire bonds and without the need for traces on the package substrate crossing the aperture 360 in the package substrate that is used to accommodate the wire bonds associated with the second chip 321.

Figure 7:
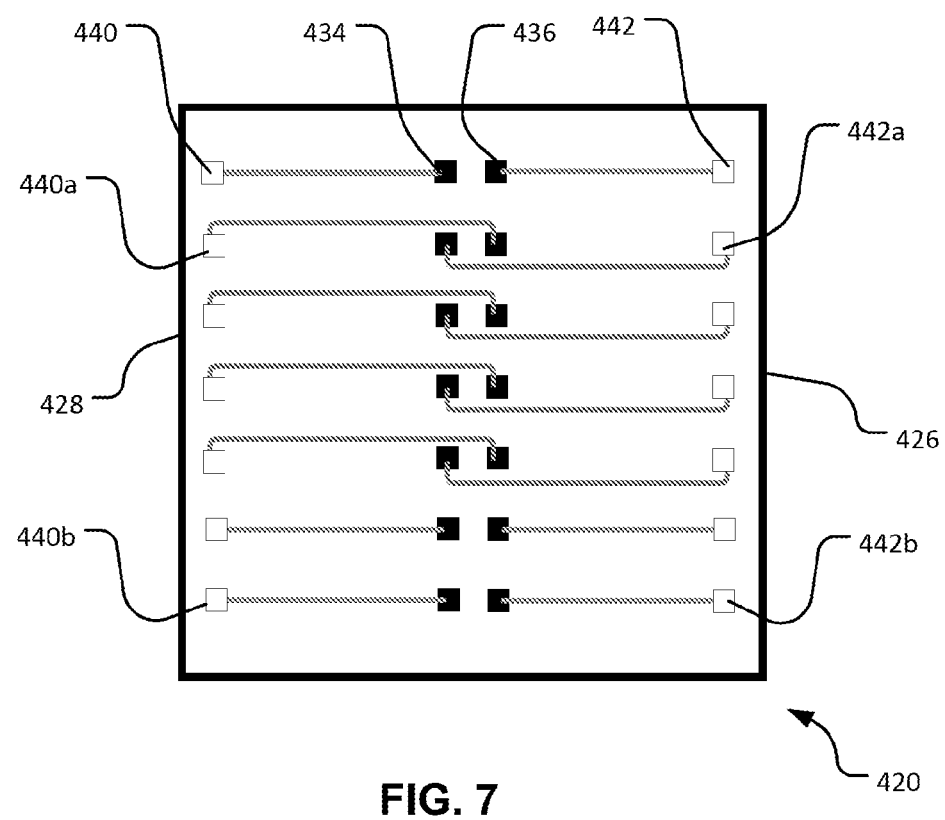
FIG. 7 is a diagrammatic top plan view of a unit in accordance with yet another embodiment of the present invention.

A unit according to a further embodiment (FIG. 7) again has a first semiconductor chip 420 with a right edge 426 and left edge 428 bounding the front surface of the chip. Here again, the chip has a left column of contacts 434 and a right column of contacts 436. This embodiment includes a left column of interconnect pads 440 and a right column of interconnect pads 442. In this embodiment, the interconnect pads serve as the external connection elements of the unit. In this embodiment as well, the interconnect pads are provided in pairs, which may be a reversal pair or non-reversal pair. In a reversal pair, the left column interconnect element 440 is connected to the right column contact 436 of the associated pair and the right column interconnect pad 442 is connected to the left column contact 434 of the associated pair. For example, interconnect pads 440a and 442a are a reversal pair. In a non-reversal pair, such as interconnect pads 440b and 442b, the left column interconnect pad 440b is connected to the left-hand contact 434, whereas the right column interconnect pad 442b is connected to the right column contact 436. In this embodiment, once again, the left column interconnect pads 440 form a first set of external connection elements, whereas the right column interconnect pads 442 form a second set of external connection elements. Once again, the first set is disposed to the left of the second set, but includes at least some external connection elements that are connected to contacts of the right column. In this embodiment, the two columns of interconnect pads are disposed on opposite sides of the columns of contacts. Also, in this embodiment, the columns of interconnect pads lie adjacent the edges 426 and 428 of the chip. This allows for the use of shorter wire bonds for connection to a package substrate.

Numerous variations and combinations of the features discussed above can be utilized without departing from the present invention. For example, in a two-chip package such as the packages discussed above with respect to FIGS. 2, 4, and 6, the positions of the first and second chips can be reversed. That is, the unit incorporating the first chip and the external connection elements, such as interconnect pads, can be disposed in face-down orientation, with the front face of the first chip facing downwardly and with the external connection elements of the unit aligned with the slot in the package substrate. Alternatively, a unit incorporating the external connection elements as discussed above can be utilized without a second chip, in a single chip package, with the unit positioned either in face-up or face-down orientation or in other forms of packages with or without plural chips.

The chip incorporated in the unit with external connection elements such as interconnect pads may have more than two columns of contacts, and any two columns of contacts may serve as the right and left contacts referred to herein.

As these and numerous other variations and combinations of the features discussed above can be utilized without departing from the present invention, the foregoing description of the preferred embodiments should be taken by way of illustration, rather than by way of limitation, of the invention as defined by the claims.

The invention claimed is:
1. A semiconductor unit comprising:
  (a) a first chip having oppositely-directed front and rear surfaces, left and right edges spaced apart from one another in a lateral direction and bounding the front and rear surfaces; and left and right columns of contacts at the front surface extending in a column direction transverse to the lateral direction; and
  (b) interconnect pads overlying the front surface of the chip, the interconnect pads being connected to at least some of the contacts, the interconnect pads and the contacts or the interconnect pads alone forming an array of external connection elements such that a first set of the external connection elements including at least some contacts of the right column or interconnect pads connected to contacts of the right column is disposed to the left of a second set of the external connection elements including at least some contacts of the left column or interconnect pads connected to contacts of the left column.

2. A semiconductor unit as claimed in claim 1 wherein the interconnect pads constitute all of the external connection elements.

3. A semiconductor unit as claimed in claim 1 wherein the interconnect pads are arranged in at least one column, each column of interconnect pads extending in the column direction and being offset in the lateral direction from the columns of contacts.

4. A semiconductor unit as claimed in claim 1 wherein the contacts include pairs including one contact of the left column and one contact of the right column, the interconnect pads including pairs of interconnect pads associated with at least some of the pairs of contacts, each such pair of interconnect pads including a left interconnect pad connected to one contact of the associated pair of contacts and a right interconnect pad disposed to the right of the left interconnect pad connected to the other contact of the associated pair of contacts, the first set of external connection elements including the left interconnect pads, the second set of external connection elements including the right interconnect pads.

5. A semiconductor unit as claimed in claim 4 wherein the pairs of interconnect pads include one or more reversal pairs, the left interconnect pad of each reversal pair being connected to the right contact of the associated pair of contacts, the right interconnect pad of each reversal pair being connected to the left contact of the associated pair of contacts.

6. A semiconductor unit as claimed in claim 5 wherein the pairs of interconnect pads include one or more non-reversal pairs, the left interconnect pad of each non-reversal pair being connected to the left contact of the associated pair of contacts, the right interconnect pad of each non-reversal pair being connected to the right contact of the associated pair of contacts.

7. A semiconductor unit as claimed in claim 6 wherein the pairs of contacts are disposed so that the left interconnect pads form a left column of interconnect pads and the right interconnect pads form a right column of interconnect pads, the columns of interconnect pads extending in the column direction.

8. A semiconductor unit as claimed in claim 7 wherein the left and right columns of interconnect pads are disposed to the right of right column of contacts.

9. A semiconductor unit as claimed in claim 8 wherein the left and right columns of interconnect pads are disposed adjacent one another.

10. A semiconductor unit as claimed in claim 8 further comprising a redistribution interposer disposed on the front surface of the chip, the interconnect pads being disposed on the redistribution interposer, the redistribution interposer also having bond pads thereon electrically connected to the interconnect pads, the interconnect pads being electrically connected to the contacts through the bond pads.

11. A semiconductor unit as claimed in claim 10 wherein the bond pads are disposed in pairs, each pair of bond pads being associated with one said pair of interconnect pads and one said pair of contacts, the bond pads and contacts being arranged so that for each pair of bond pads and the associated pair of contacts, a first bond pad and a first contact are disposed at locations in the lateral directions spaced apart from one another, and a second bond pad a second contact are disposed at locations in the lateral direction between the locations of first bond pad and the first contact, the unit further comprising first wire bonds connecting the first contacts and first bond pads, and second wire bonds connecting the second contacts and second wire bonds.

12. A semiconductor unit as claimed in claim 11 wherein the first wire bonds extend above the second wire bonds.

13. A semiconductor unit as claimed in claim 1 further comprising a redistribution layer overlying at least a portion of the front surface of the chip, the redistribution layer including the interconnect pads and redistribution conductors connecting the interconnect pads to at least some of the contacts on the chip.

14. A semiconductor unit as claimed in claim 13 wherein the interconnect pads include right interconnect pads disposed to the right of the right column of contacts and left interconnect pads disposed to the left of the left column of contacts, at least some of the right interconnect pads being connected to contacts of the left column, at least some of the left interconnect pads being connected to contacts of the right column.

15. A unit as claimed in claim 14 wherein the left and right columns of contacts are remote from the left and right edges of the chip, the left interconnect pads are disposed adjacent the left edge of the chip and the right interconnect pads are disposed adjacent the right edge of the chip.

16. A unit as claimed in claim 1 wherein the chip is a memory chip and wherein the contacts connected to the first interconnect pads include address and data contacts.

17. A method of processing a plurality of substantially identical semiconductor chips comprising providing interconnect pads on some of the chips so as to from units as claimed in claim 1 and leaving others of the chips without the interconnect pads.

18. A semiconductor package comprising:
(a) a first chip having oppositely-directed front and rear surfaces, left and right edges spaced apart from one another in a lateral direction and bounding the front and rear surfaces; and left and right columns of contacts at the front surface extending in a column direction transverse to the lateral direction; and
(b) interconnect pads overlying the front surface of the first chip, the interconnect pads being connected to at least some of the contacts, the interconnect pads and the contacts or the interconnect pads alone forming an array of external connection elements such that a first set of the external connection elements including at least some contacts of the right column or interconnect pads connected to contacts of the right column is disposed to the left of a second set of the external connection elements including at least some contacts of the left column or interconnect pads connected to contacts of the left column;
(c) a package substrate, the first chip being disposed above the package substrate with the front surface of the first semiconductor chip facing upwardly;
(d) left leads extending from the first set of the external connection elements over left edge of the first semiconductor chip to the package substrate;
(e) right leads extending from the second set of the external connection elements over the right edge of the first semiconductor chip to the package substrate.

19. A package as claimed in claim 18 wherein the left and right leads are wire bonds.

20. A chip package as claimed in claim 18 further comprising a second chip having oppositely-directed front and rear surfaces, left and right edges spaced apart from one another in a lateral direction and bounding the front and rear surfaces; and contacts at the front surface, the first and second chips being disposed in a stack with the rear surfaces of the chips facing one another, the front surface of the second chip facing downwardly so that the left edge of the first chip and the right edge of the second chip define a left side of the stack and the right edge of the first chip and the left edge of the second chip defining a right side of the stack.

21. A chip package as claimed in claim 20 wherein the package substrate has a bottom surface and terminals at the bottom surface, at least some of the terminals being electrically connected to at least some of the contacts on the first chip through the left and right leads, at least some of the electrical connections between terminals and contacts of the first chip including the interconnect pads.

22. A package as claimed in claim 21 wherein at least some of the terminals of package substrate are also electrically connected to the contacts of the second chip, at least some of the terminals being common terminals, each common terminal being connected to a contact of the first chip and a contact of the second chip.

23. A package as claimed in claim 22 wherein the contacts of the first and second chips are disposed in substantially identical arrangements on the front surfaces of the first and second chips, and wherein the common terminals are connected to contacts at corresponding locations on the first and second chips.

24. A package as claimed in claim 23 wherein the first and second chips are substantially identical to one another.

25. A package as claimed in claim 24 wherein the first and second chips are memory chips, and wherein the common terminals are connected to address and data contacts of the first and second chips.

26. A package as claimed in claim 16 wherein the package substrate has a bond window aligned with the contacts of the second chip.

27. A package as claimed in claim 26 wherein the terminals include left terminals offset from the bond window toward the left side of the stack and the right terminals of offset from the bond window toward the right side of the stack, at least some of the left terminals being connected to contacts of the first chip through the left leads, at least some of the right terminals being connected to contacts of the first chip through the right leads.

28. A method of making a chip package comprising:
(a) providing an assembly including:
(1) a unit including
(i) a first chip having oppositely-directed front and rear surfaces, left and right edges spaced apart from one another in a lateral direction and bounding the front and rear surfaces; and left and right columns of contacts at the front surface extending in a column direction transverse to the lateral direction; and
(ii) interconnect pads overlying the front surface of the chip, the interconnect pads being connected to at least some of the contacts, the interconnect pads and the contacts or the interconnect pads alone forming an array of external connection such that a first set of the external connection elements including at least some contacts of the right column or interconnect pads connected to contacts of the right column is disposed to the left of a second set of the external connection elements including at least some contacts of the left column or interconnect pads connected to contacts of the left column; and (2) a package substrate, the first chip being disposed above the package substrate with the front surface of the first semiconductor chip facing upwardly; and (b) connecting left leads so that the left leads extend from the first set of external connection elements, over the left edge of the first chip and to the package substrate; and (c) connecting right leads so that the right leads extend from the first set of external connection elements, over the right edge of the first chip and to the package substrate.

* * * * *